United States Patent
Totani

(10) Patent No.: US 10,672,947 B2
(45) Date of Patent: Jun. 2, 2020

(54) METHOD FOR PRODUCING LIGHT-EMITTING DEVICE

(71) Applicant: TOYODA GOSEI CO., LTD., Kiyosu-shi (JP)

(72) Inventor: Shingo Totani, Kiyosu (JP)

(73) Assignee: TOYODA GOSEI CO., LTD, Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 16/041,551

(22) Filed: Jul. 20, 2018

(65) Prior Publication Data
US 2019/0067513 A1  Feb. 28, 2019

(30) Foreign Application Priority Data
Aug. 31, 2017  (JP) .................. 2017-168077

(51) Int. Cl.
| | |
|---|---|
| H01L 33/00 | (2010.01) |
| H01L 33/38 | (2010.01) |
| H01L 33/10 | (2010.01) |
| H01L 33/48 | (2010.01) |
| H01L 33/60 | (2010.01) |

(52) U.S. Cl.
CPC .......... *H01L 33/0075* (2013.01); *H01L 33/10* (2013.01); *H01L 33/38* (2013.01); *H01L 33/486* (2013.01); *H01L 33/60* (2013.01)

(58) Field of Classification Search
CPC ... H01L 33/486; H01L 33/502; H01L 33/505; H01L 33/507; H01L 33/54; H01L 33/56; H01L 2933/0041; H01L 2933/005; H01L 2115/10
See application file for complete search history.

(56) References Cited

U.S. PATENT DOCUMENTS

| | | | | |
|---|---|---|---|---|
| 8,174,028 B2* | 5/2012 | Ogihara | ............... | G03G 15/326 257/79 |
| 2009/0057705 A1* | 3/2009 | Takashima | .............. | H01L 23/14 257/99 |
| 2010/0212942 A1* | 8/2010 | Tuan | .................... | H01L 23/3735 174/257 |
| 2016/0020353 A1* | 1/2016 | Chu | .................. | H01L 31/02327 257/21 |

(Continued)

FOREIGN PATENT DOCUMENTS

JP  2007-266647 A  10/2007

*Primary Examiner* — Zandra V Smith
*Assistant Examiner* — Andre C Stevenson
(74) *Attorney, Agent, or Firm* — McGinn I.P. Law Group, PLLC.

(57) ABSTRACT

A metal layer is formed by vapor deposition or sputtering on an AlN substrate. Since there are irregularities on the surface of the substrate, irregularities are also formed on the surface of the metal layer. Subsequently, irregularities on the surface of the metal layer are removed and flattened in a mirror state by grinding the surface of the metal layer. Then, a dielectric layer is formed on the metal layer by alternately forming a $SiO_2$ film and a $TiO_2$ film through CVD. Next, an electrode layer is formed in a predetermined pattern by vapor deposition and lift-off on the dielectric layer. Since the surface of the metal layer is flattened in a mirror state, reflectance is high on that surface. As a result, the emission efficiency of the light-emitting device can be improved.

13 Claims, 4 Drawing Sheets

(56) References Cited

U.S. PATENT DOCUMENTS

2016/0308101 A1* 10/2016 Konishi ................ H01L 33/641
2017/0092815 A1* 3/2017 Ichikawa ................ H01L 33/46
2018/0240950 A1* 8/2018 Jang ........................ H01L 33/46

* cited by examiner

METHOD FOR PRODUCING LIGHT-EMITTING DEVICE

BACKGROUND OF THE INVENTION

Field of the Invention

The present invention relates to a method for producing a light-emitting device having a light-emitting diode mounted on a mounting substrate, specifically the method having a feature in a method for producing a mounting substrate.

Background Art

In a LED package for flowing large current such as a vehicle headlamp, an AlN substrate having insulation properties and high heat transfer characteristics is often used. To increase light extraction efficiency, light emitted from the LED to the AlN substrate is preferably reflected. Therefore, a DBR (Distributed Bragg Reflector) layer or a metal layer made of a high reflective metal such as Ag may be formed on the AlN substrate. However, there are irregularities on the surface of the AlN substrate. Even if the DBR layer or the reflective metal layer is formed, reflectance cannot be sufficiently increased.

Japanese Patent Application Laid-Open (kokai) No. 2007-266647 discloses a light-emitting device having a light-emitting diode mounted on an AlN substrate, and that after the surface of the AlN substrate is flattened by grinding, an Al or Ag metal layer is formed. In this way, reflectance is improved by forming a metal layer after flattening the surface of the substrate.

However, the AlN substrate is made of ceramic. Therefore, processing is difficult and costs much. There was a problem that the crystal grains on the surface are removed by grinding the surface for flattening, resulting in the worsening of surface flatness. When surface flattening is insufficient, reflectance is not sufficiently improved.

SUMMARY OF THE INVENTION

Thus, an object of the present invention is to improve reflectance of a mounting substrate.

The present invention is a method for producing a light-emitting device having a light-emitting diode mounted on a ceramic mounting substrate, wherein a process for producing a mounting substrate comprises a metal layer formation step of forming a metal layer on a ceramic substrate, a grinding step of grinding and flattening the surface of the metal layer, a dielectric layer formation step of forming a dielectric layer on the metal layer, and an electrode layer formation step of forming an electrode layer being connected to the light-emitting diode on the dielectric layer.

The method for producing a light-emitting device may further comprise a reflective dielectric layer formation step of forming a reflective dielectric layer on the dielectric layer and on the electrode layer excluding a region being connected to the light-emitting diode and an effective region for an external electric connection after the formation of the electrode layer, the reflective dielectric layer being set to a thickness so as to reflect light from the light-emitting diode by light interference. The reflective dielectric layer can suppress absorption of light by the electrode layer excluding a region being connected to the light-emitting diode and can extract light to the outside by reflecting light, thereby further improving the emission efficiency of the light-emitting device.

The method for producing a light-emitting device may further comprise a reflective metal layer formation step of forming a reflective metal layer made of a metal with high reflectance between the metal layer and the dielectric layer. Or, the metal layer itself may be made of a metal with high reflectance. Thereby, the reflectance of the mounting substrate can be further improved, and the emission efficiency of the light-emitting device can be further improved.

In the grinding step, the surface of the metal layer is preferably ground so as to have an arithmetic average roughness Ra of 30 nm or less. Thus, the reflectance on the surface of the metal layer is further improved, thereby improving the emission efficiency of the light-emitting device.

The thickness of the dielectric layer is preferably set so as to reflect light from the light-emitting diode by light interference. For example, the dielectric layer is preferably a dielectric multilayer film (DBR film). Thus, the emission efficiency of the light-emitting device can be further improved by reflection by the dielectric layer.

The present invention is especially effective when a substrate having a surface arithmetic average roughness Ra of 100 nm or more is used.

According to the present invention, reflectance of the mounting substrate can be improved, thereby improving the emission efficiency of the light-emitting device. The present invention does not include a step of polishing a ceramic substrate. Therefore, the light-emitting device can be produced at a low cost.

BRIEF DESCRIPTION OF THE DRAWINGS

Various other objects, features, and many of the attendant advantages of the present techniques will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
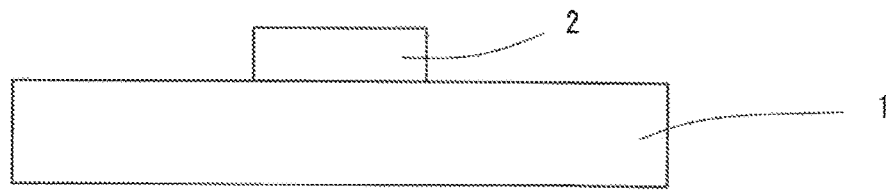
FIG. 1 shows the structure of a light-emitting device according to Embodiment 1.

FIG. 1 shows the structure of a light-emitting device according to Embodiment 1. As shown in FIG. 1, the light-emitting device according to Embodiment 1 has a mounting substrate 1 and a light-emitting device 2, and the light-emitting diode 2 is mounted on the mounting substrate 1. The light-emitting diode 2 may have any conventionally known structure, and may be covered with a resin layer mixed with phosphor. For example, a white light-emitting diode may be achieved by having a structure in which a blue light-emitting diode 2 is covered with a resin layer mixed with yellow phosphor.

Figure 2:
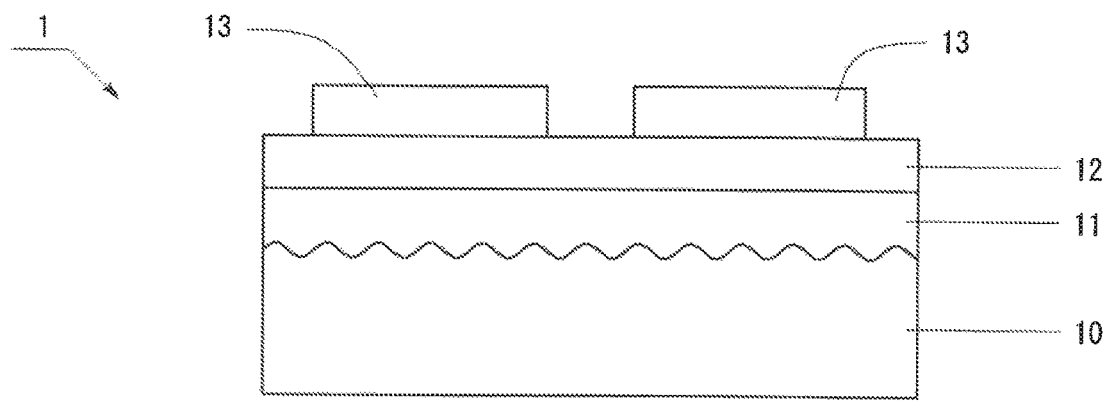
FIG. 2 shows the structure of a mounting substrate 1.

Next will be described the structure of the mounting substrate 1 in detail. The mounting substrate 1 has a substrate 10, a metal layer 11 formed on the substrate 10, a dielectric layer 12 formed on the metal layer 11, and an electrode layer 13 formed on the dielectric layer 12 as shown in FIG. 2.

The substrate 10 is formed of AlN, and has irregularities on the surface thereof, and the surface arithmetic average roughness Ra is 300 nm. Since AlN has excellent heat conductivity, heat of the light-emitting diode 2 can be efficiently conducted through the substrate 10 to the outside. Thus, a light-emitting device with high heat dissipation is achieved.

The material of the substrate 10 is not limited to AlN, and any insulating ceramic material may be used. For example, SiC, SiN, $Al_2O_3$ may be used other than AlN. However, AlN having high heat conductivity is particularly preferable as in Embodiment 1. It is especially effective when a substrate having a surface arithmetic average roughness of 100 nm or more is used. Even if a substrate having such large irregularities is used, reflectance can be improved according to Embodiment 1.

The metal layer 11 is formed on the substrate 10, and comprises Ti/Pt/Al. Here, the symbol "/" means that layers are deposited. A/B means a layered structure in which layer B is formed after layer A was formed. The symbol "/" will be used in the same meaning in the description of materials provided below. The layers of the metal layer 11 have a thickness of 50 nm, 100 nm, and 3,000 nm in order from the substrate 10.

The surface of the metal layer 11 is flattened into a mirror surface by grinding. Thus, reflectance of light transmitting through the dielectric layer 12 and reaching the surface of the metal layer 11 is improved, thereby improving the emission efficiency of the light-emitting device.

The surface arithmetic average roughness of the metal layer 11 is preferably 30 nm or less. Reflectance of the mounting substrate 1 can be improved, thereby improving the emission efficiency of the light-emitting device. The surface arithmetic average roughness of the metal layer 11 is more preferably 20 nm or less, and further preferably, 10 nm or less.

The thickness of the metal layer 11 is not limited to the above values. However, the thickness is preferably 100 nm or more so as not to transmit light through the metal layer 11. The thickness of the metal layer 11 is more preferably 200 nm or more, and further preferably 300 nm or more.

Figure 6:
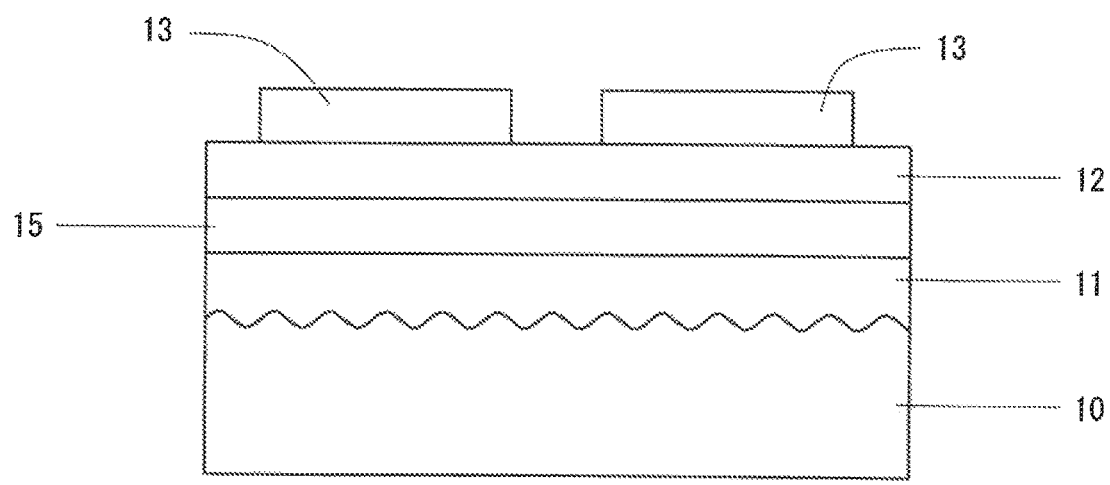
FIG. 6 shows the structure of the mounting substrate according to a variation.

In Embodiment 1, Al being a metal with high reflectance (for example, reflectance of 90% or more with respect to the emission wavelength of the light-emitting diode 2) is used to improve reflectance. However, any other metal with high reflectance, for example, Ag or Rh may be used. A metal with low reflectance, for example, Cu or Au may be used. When a metal with low reflectance is used as the metal layer 11, a reflective metal layer 15 made of a metal with high reflectance is preferably formed between the metal layer 11 and the dielectric layer 12 (refer to FIG. 6). The reflective metal layer 15 comprises a double layer structure, for example, Ti/Al and Ti/Ag, and the thickness of the respective layers are 50 nm and 100 nm in order from the metal layer 11. When the reflective metal layer 15 is formed, a material with low reflectance may be used as the metal layer 11, thereby allowing the selection of various materials. For example, a metal with low reflectance but easy to grind or a metal easy to form to be thicker for printing may be used as metal layer 11, thereby facilitating grinding the surface of the metal layer 11 in a mirror state.

The dielectric layer 12 is formed on the surface of the metal layer 11 flattened by grinding. The dielectric layer 12 is a dielectric multilayer film (Distributed Bragg Reflector film) in which dielectric layers with different refractive indices are alternately and repeatedly formed in a predetermined thickness, and a reflective film using light interference. The dielectric layer 12 reflects light emitted from the light-emitting diode 2 to the counter side of the light extraction (side of the mounting substrate 1) toward the light extraction side to improve the light extraction efficiency. In Embodiment 1, $SiO_2$ and $TiO_2$ are used. Needless to say, any other material may be used. Since the surface of the metal layer 11 is mirror finished, interfaces between the layers of the dielectric layer 12 are also in a mirror state. Thus, the reflectance of the dielectric layer 12 can be improved, and the dielectric multilayer film can easily have a predetermined reflectance. For example, the arithmetic average roughness Ra of the interfaces between the respective layers of the dielectric layer 12 is preferably 30 nm or less.

The dielectric layer 12 is not necessarily a multilayer film, and may be a single layer. In both cases where the dielectric layer 12 is a single layer or a multilayer, the thickness is preferably set so as to achieve high reflectance by light interference. For example, when the dielectric layer 12 is a single layer, the thickness of the dielectric layer 12 is $\lambda/(4n)$. Here, $\lambda$ is an emission wavelength of the light-emitting diode 2, and n is a refractive index of the dielectric layer 12. Therefore, light from the light-emitting diode 2 made incident perpendicularly to the dielectric layer 12 can be efficiently reflected.

Figure 3:
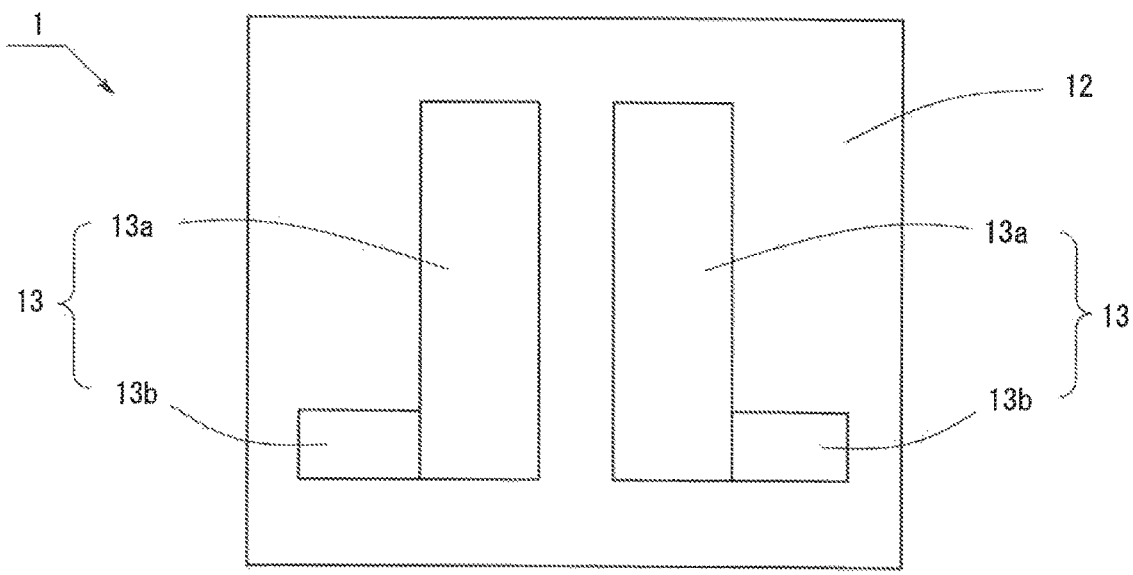
FIG. 3 shows the pattern of an electrode layer 13.

The electrode layer 13 is formed in a predetermined region on the dielectric layer 12. FIG. 3 shows the planar pattern of the electrode layer 13. As shown in FIG. 3, the electrode layer 13 has two rectangular junction electrode portions 13a and two linear external junctions 13b which are connected to two junction electrode portions 13a, respectively. The junction electrode portion 13a is a region connected to the junction electrode of the light-emitting diode 2. The external junction 13b is a region connected to the outside of the light-emitting device according to Embodiment 1. The electrode layer 13 comprises Ti/Pt/Au, and the thickness of the respective layers is 50 nm, 100 nm, and 1,000 nm in order from the dielectric layer 12.

Processes for producing a light-emitting device according to Embodiment 1 will next be described with reference to FIGS. 4A to 4D.

Firstly, processes for producing a mounting substrate 1 are described. An AlN substrate 10 is prepared, and a metal layer 11 is formed on the substrate 10 by vapor deposition or sputtering (refer to FIG. 4A). Since there are irregularities on the surface of the substrate 10, irregularities are also formed on the surface of the metal layer 11. The metal layer 11 is preferably formed so as to have a thickness of 3 µm or more, considering that the surface of the metal layer 11 is ground in the next step. However, the thickness of the metal layer 11 is preferably 10 µm or less because it takes time to form the metal layer 11 when the thickness is too thick.

In Embodiment 1, the surface of the substrate 10 does not need to be polished and flattened. High-cost ceramic polishing step can be omitted, thereby reducing the production cost of the light-emitting device.

The metal layer 11 can be formed by printing other than vapor deposition or sputtering. In the case of printing, the metal layer 11 can be easily formed so as to have a large thickness (for example, 3 μm to 10 μm). In the case of vapor deposition or sputtering, cooling period needs to be interposed to prevent the resist used in lift-off from being deteriorated due to heat, and it takes a long time to form the metal layer 11. On the other hand, in the case of printing, the metal layer 11 can be easily formed using metal paste or metal nano ink so as to have a large thickness.

When the metal layer 11 is formed by printing, firstly, Ti/Au is formed as a base layer by vapor deposition or sputtering. Ti is used to improve adhesion with the substrate 10, and Au is used to improve adhesion with metal paste or metal nano ink.

Next, metal paste or metal nano ink is applied by printing on the base layer. Any printing method such as screen printing and ink jet printing may be used, but screen printing is simple and preferable. Au or Cu may be used as a metal of metal paste and metal nano ink. In terms of reliability, Au is preferably used. When Cu is used, Au as a base layer may be omitted, i.e., Ti/Cu as the metal layer 11.

Subsequently, solvent in metal paste or metal nano ink is evaporated by heating to decompose the binder. After that, solvent residue is removed by washing. From the above, a thick metal layer 11 can be formed with good pattern accuracy in a short time.

Figure 4A:
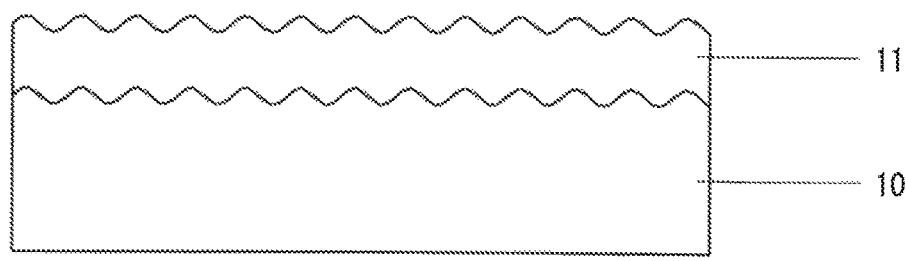
FIGS. 4A to 4D are sketches showing processes for producing a light-emitting device according to Embodiment 1.
Figure 4B:
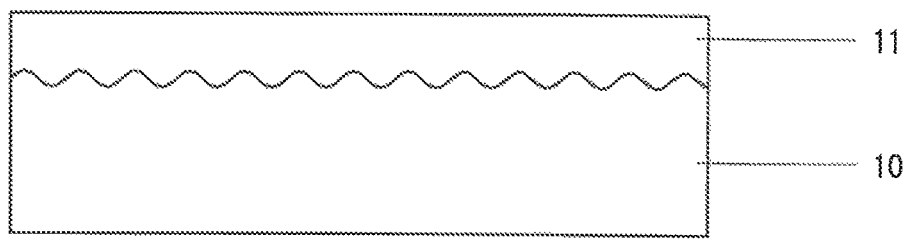

Irregularities on the surface of the metal layer 11 are removed and flattened in a mirror state by grinding the surface of the metal layer 11 (refer to FIG. 4B). For example, the surface of the metal layer 11 is preferably ground so as to have an arithmetic average roughness Ra of 30 nm or less. Since grinding is mechanical processing, it does not depend on the material of the metal layer 11, and the grinding thickness can be easily set. Grinding can be performed by, for example, a diamond bite or a grinding wheel. The grinding thickness can be easily and accurately controlled by these grinding methods.

The thickness of the metal layer 11 after grinding is preferably 100 nm or more. When the thickness is smaller than 100 nm, light is not sufficiently reflected by the metal layer 11, and some lights are transmitted to the substrate 10 side. The thickness of the metal layer 11 after grinding is, more preferably, 200 nm or more, and further preferably, 300 nm or more. The thickness of the metal layer 11 after grinding is preferably 3,000 nm or less. It is because when the metal layer 11 is larger than 3,000 nm, reflectance is not particularly affected, and it takes a long time to form the metal layer 11. The thickness of the metal layer 11 after grinding is more preferably 2,000 nm or less, and further preferably, 1,000 nm or less.

Figure 4C:
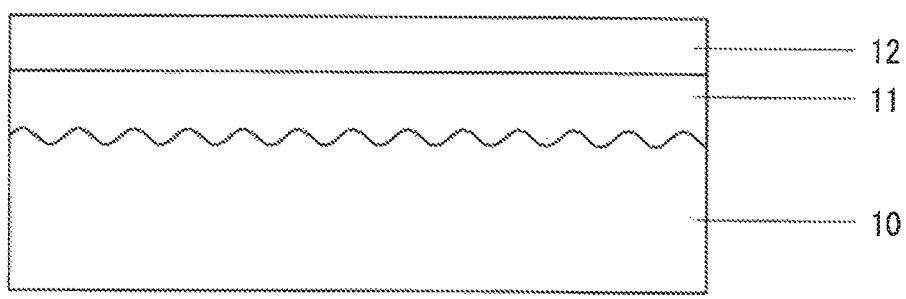

A dielectric layer 12 is formed on the metal layer 11 by alternately forming a $SiO_2$ film and a $TiO_2$ film by vapor deposition or sputtering (FIG. 4C). The thicknesses of the $SiO_2$ film and $TiO_2$ film are set so as to have a high reflectance (for example, 90% or more) by light interference. Since the surface of the metal layer 11 is flat, the interfaces between the respective layers of the dielectric layer 12 are also flat. As a result, reflectance is improved.

When a metal with low reflectance is used as the metal layer 11, a reflective metal layer 15 made of a metal with high reflectance is formed, and then, a dielectric layer 12 may be formed on the reflective metal layer 15.

Figure 4D:
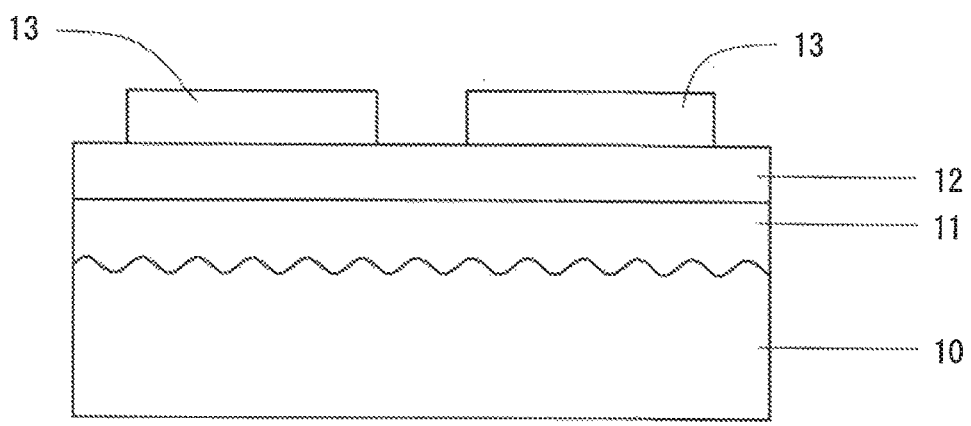

An electrode layer 13 is formed in a predetermined pattern by vapor deposition and lift-off on the dielectric layer 12 (refer to FIG. 4D).

The positions of the junction electrode portions 13a of the produced mounting substrate 1 are aligned with the positions of the junction electrodes of the light-emitting diode 2, and the junction electrode portions 13a are connected to the junction electrodes by heating under pressure or Au bumping. Through the above processes, the light-emitting device according to Embodiment 1 is produced.

The effects of the method for producing a light-emitting device according to Embodiment 1 are summarized as follows.

Firstly, since the surface of the metal layer 11 is flattened in a mirror state, reflectance is high on that surface so that light emitted from the light-emitting diode 2 to the mounting substrate 1 can be efficiently reflected. As a result, the emission efficiency of the light-emitting device can be improved.

Secondly, since the surface of the metal layer 11 is flattened in a mirror state, the interfaces between the respective layers of the dielectric layer 12 being a dielectric multilayer film can also be formed in a mirror state. Therefore, the reflectance of the dielectric layer 12 can be easily set to a predetermined value.

Thirdly, since the surface of the ceramic substrate 10 does not need to be polished, high-cost ceramic polishing step can be omitted, thereby reducing the production cost of the light-emitting device.

Embodiment 2

In a method for producing a light-emitting device according to Embodiment 2, the processes for producing a mounting substrate 1 in the method for producing a light-emitting device according to Embodiment 1 are changed as follows. The description of the processes until FIG. 4B are omitted because they are the same between Embodiments 1 and 2.

Figure 5A:
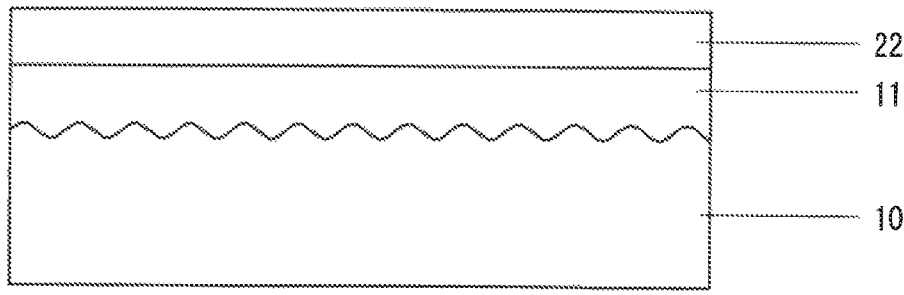
FIGS. 5A to 5C are sketches showing processes for producing a light-emitting device according to Embodiment 2.

In Embodiment 2, after the surface of the metal layer 11 is ground, a dielectric layer 22 made of $SiO_2$ having a thickness of 300 nm is formed through CVD on the metal layer 11 (refer to FIG. 5A). The dielectric layer 22 may be a dielectric multilayer film as in Embodiment 1. When a metal with low reflectance is used as the metal layer 11, a reflective metal layer 15 made of a metal with high reflectance is preferably formed between the metal layer 11 and the dielectric layer 12 as in Embodiment 1.

Figure 5B:
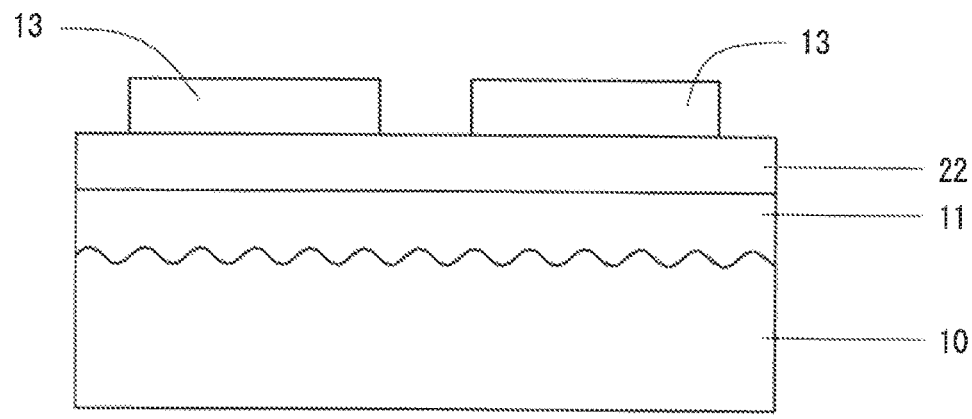

Subsequently, an electrode layer 13 is formed in the same pattern as in Embodiment 1 is formed by vapor deposition or lift-off on the dielectric layer 22 (refer to FIG. 5B).

Figure 5C:
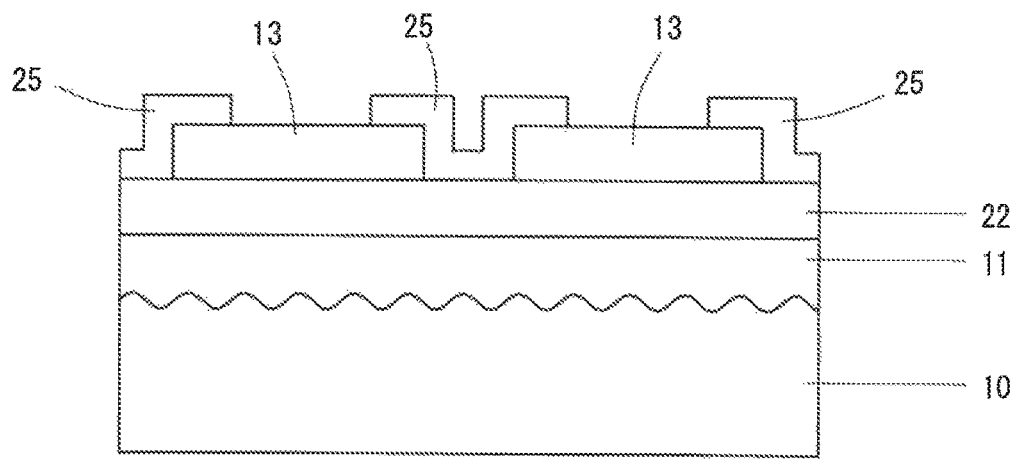

Next, a reflective dielectric layer 25 is formed by vapor deposition or lift-off on the dielectric layer 22 and on the electrode layer 13. The reflective dielectric layer 25 is a dielectric multilayer film formed by alternately and repeatedly depositing a $SiO_2$ film and a $TiO_2$ film in a predetermined thickness. The reflective dielectric layer 25 is not limited to a dielectric multilayer film. As long as the thickness is set so as to achieve high reflectance by light interference, the reflective dielectric layer 25 may be a single layer. A region corresponding to the top of the junction electrode portions 13a of the electrode layer 13 of the reflective dielectric layer 25 is removed by photolithography or dry etching, to expose the surface of the junction electrode portions 13a of the electrode layer 13 (refer to FIG. 5C).

According to Embodiment 2, an area reflecting light by the reflective dielectric layer 25 can be increased. Specifically, the region of the external junctions 13b other than an effective region for an external electric connection, which is a region not being connected to the light-emitting diode 2, can be covered with the reflective dielectric layer 25. Therefore, light traveling toward the external junctions 13b can be suppressed from being absorbed, and can be extracted to the outside by reflecting. As a result, the emission efficiency of the light-emitting device can be improved.

The light-emitting device according to the present invention can be employed as various light sources such as vehicle headlamp and general illumination.

What is claimed is:

1. A method for producing a light-emitting device having a light-emitting diode mounted on a ceramic mounting substrate, wherein a process for producing the mounting substrate comprises; forming a metal layer on and contacted with a surface of an insulating ceramic substrate made of AlN, the surface having, a surface arithmetic average roughness of 100 nm or more, and the metal layer having a thickness of 3 μm or more and 10 μm or less: grinding and flattening a surface of the metal layer formed on the ceramic substrate for the metal layer to have any thickness in a range from 100 nm to 3,000 nm, the surface being flattened into a mirror surface with a surface arithmetic average roughness of which is 30 nm or less: forming a dielectric layer on the grinded and flattened surface of the metal layer, a surface of dielectric layer being a mirror surface: and forming an electrode layer being connected to the light-emitting diode on the mirror surface of the dielectric layer.

2. The method for producing a light-emitting device according to claim 1, wherein the method further comprises forming a reflective dielectric layer on the dielectric layer and on the electrode layer excluding a region being connected to the light-emitting diode and an effective region for an external electric connection after the formation of the electrode layer, the reflective dielectric layer being set to a thickness so as to reflect light from the light-emitting diode by light interference.

3. The method for producing a light-emitting device according to claim 1, wherein the method further comprises forming a reflective metal layer made of a metal with high reflectance between the metal layer and the dielectric layer.

4. The method for producing a light-emitting device according to claim 2, wherein the method further comprises forming a reflective metal layer made of a metal with high reflectance between the metal layer and the dielectric layer.

5. The method for producing a light-emitting device according to claim wherein the metal layer is made of a metal with high reflectance.

6. The method for producing a light-emitting device according to claim 1, wherein the metal layer is made of a Ti layer formed on the substrate, a Pt layer formed on the Ti layer, and an Al layer formed on the Pt layer.

7. The method for producing a light-emitting device according to claim 1, wherein the metal layer is made of a Ti layer formed on the substrate, at least one of an Au layer and a Cu layer formed on the Ti layer.

8. The method for producing a light-emitting device according to claim 3, wherein the reflective metal layer is made of a Ti layer formed on the metal layer and at least one of an Al layer and a Ag layer formed on the Ti layer.

9. The method for producing a light-emitting device according to claim 1, wherein the thickness of the dielectric layer is preferably set so as to reflect light from the light-emitting diode by light interference.

10. The method for producing a fight-emitting device according to claim 1, wherein the dielectric layer comprises a Distributed Bragg Reflector.

11. The method for producing a light-emitting device according to claim 10, wherein the Distributed Bragg Reflector is made of a $SiO_2$ film and a $TiO_2$ film.

12. The method for producing a light-emitting device according to claim 2, wherein the dielectric layer comprises a Distributed Bragg Reflector.

13. The method for producing a light-emitting device according to claim 3, wherein the dielectric layer comprises a Distributed Bragg Reflector.

* * * * *